(12) United States Patent
Krutko et al.

(10) Patent No.: US 10,756,508 B2
(45) Date of Patent: Aug. 25, 2020

(54) MONOLITHIC EML WITH ELECTRICALLY ISOLATED ELECTRODES

(71) Applicant: Qorvo US, Inc., Greensboro, NC (US)

(72) Inventors: Oleh Krutko, Colleyville, TX (US); Craig Francis Steinbeiser, Allen, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/280,375

(22) Filed: Feb. 20, 2019

(65) Prior Publication Data

US 2020/0021080 A1    Jan. 16, 2020

Related U.S. Application Data

(60) Provisional application No. 62/696,101, filed on Jul. 10, 2018.

(51) Int. Cl.
*H01S 5/026* (2006.01)
*H01S 5/042* (2006.01)
(Continued)

(52) U.S. Cl.
CPC .......... *H01S 5/0264* (2013.01); *H01S 5/0206* (2013.01); *H01S 5/0425* (2013.01); *H01S 5/12* (2013.01); *H01S 5/34* (2013.01)

(58) Field of Classification Search
CPC .... H01S 5/0264; H01S 5/0206; H01S 5/0425; H01S 5/12; H01S 5/34; H01S 5/04256;
(Continued)

(56) References Cited

U.S. PATENT DOCUMENTS 7,010,179 B2    3/2006  Hatta et al.
2003/0137023 A1*  7/2003  Stegmuller ............ B82Y 20/00
                                                         257/432
(Continued)

OTHER PUBLICATIONS

Cappelluti, F., et al., "Balanced Electroabsorption Modulator for High-Linearity, Low-Noise Microwave Analog Optical Link," Conference Digest, Conference on Lasers and Electro-Optics, Jan. 2000, 4 pages.

*Primary Examiner* — Xinning (Tom) Niu
(74) *Attorney, Agent, or Firm* — Withrow & Terranova, P.L.L.C.

(57) ABSTRACT

The present disclosure relates to a monolithic externally modulated laser (EML), which includes a substrate, a laser element, and an electro-absorption modulator (EAM). Both the laser element and the EAM reside over the substrate. The laser element includes a laser bottom electrode over the substrate, a laser core component over the laser bottom electrode, and a laser top electrode over the laser core component. The EAM includes a modulator bottom electrode over the substrate, a modulator core component over the modulator bottom electrode, and a modulator top electrode over the modulator core component. Herein, at least portions of the substrate, which are directly under the laser bottom electrode and directly under the modulator bottom electrode, are electrically non-conductive. The laser top electrode is isolated from the modulator top electrode, and the laser bottom electrode is isolated from the modulator bottom electrode.

22 Claims, 3 Drawing Sheets

Figure 1A:
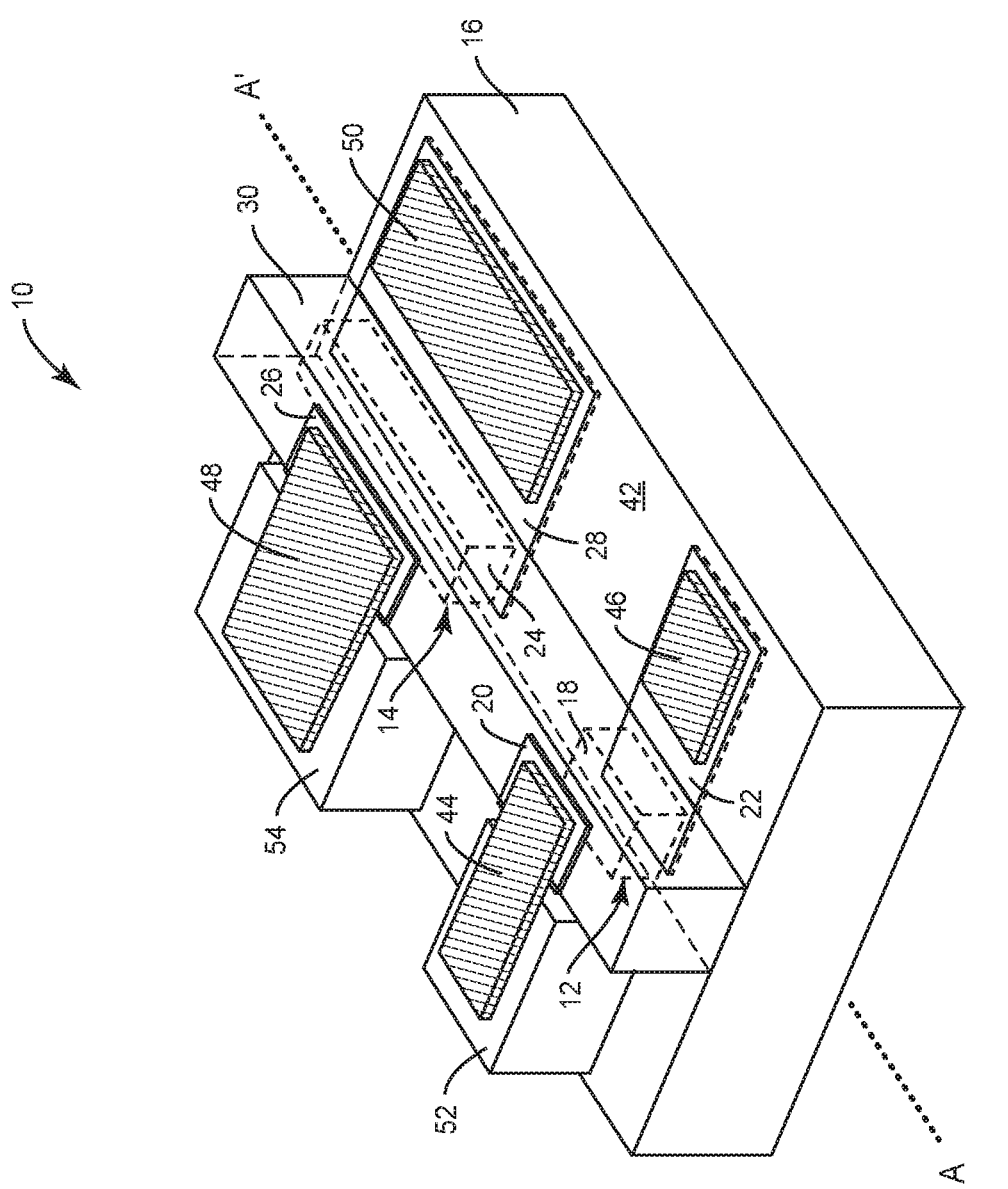

(51) Int. Cl.
*H01S 5/02* (2006.01)
*H01S 5/12* (2006.01)
*H01S 5/34* (2006.01)

(58) Field of Classification Search
CPC .... H01S 5/0265; H01S 2301/176; H01S 5/22; H01S 5/0421
See application file for complete search history.

(56) References Cited

U.S. PATENT DOCUMENTS

| | | | |
|---|---|---|---|
| 2009/0095973 A1* | 4/2009 | Tanaka | B82Y 20/00 257/99 |
| 2012/0314725 A1* | 12/2012 | Nakanishi | H01S 5/0265 372/43.01 |
| 2013/0272326 A1* | 10/2013 | Yamatoya | H01S 3/10 372/26 |

* cited by examiner

MONOLITHIC EML WITH ELECTRICALLY ISOLATED ELECTRODES

RELATED APPLICATIONS

This application claims the benefit of provisional patent application Ser. No. 62/696,101, filed Jul. 10, 2018, the disclosure of which is hereby incorporated herein by reference in its entirety.

FIELD OF THE DISCLOSURE

The present disclosure relates to a monolithic externally modulated laser (EML), and more particularly to a monolithic EML with electrically isolated electrodes.

BACKGROUND

A photonic integrated circuit is a device that uses light rather than electrons to perform a wide variety of optical functions. These optical functions are for information signals imposed on optical wavelengths, typically in the visible spectrum or near infrared 850 nm-1650 nm. Recent developments in nanostructures, metamaterials, and silicon technologies have expanded the range of possible functionalities for these highly integrated optical chips.

Externally modulated laser (EML) is one important application of the photonic integrated circuit, which combines at least one distributed laser element with an electro-absorption modulator on a single chip. Typically, the existing EMLs are designed such that the laser element and the modulator share an electrical bottom electrode (may be a highly-doped conductive substrate). This allows simple grounding of both the laser element and the modulator using the bottom electrode. Top metal electrodes of the EML may be used for biasing the laser element and the modulator and for driving the modulator with a high speed electrical signal.

However, with this typical structure, the modulator must be driven by a single-ended signal, which leads to increased power consumption of the driver and requires using expensive high breakdown technologies. One approach to resolve the problem is to separate the laser element and the modulator to different chips, which, unfortunately, increases optical loss between the laser element and the modulator and impacts output power.

Accordingly, there remains a need for EML designs to isolate top and bottom electrodes of the laser element and the modulator, while keeping the laser element and the modulator within a same chip.

SUMMARY

The present disclosure relates to a monolithic externally modulated laser (EML) with electrically isolated electrodes. The disclosed EML includes a substrate, a laser element, and an electro-absorption modulator (EAM). Both the laser element and the EAM reside over the substrate. The laser element includes a laser bottom electrode over the substrate, a laser core component over the laser bottom electrode, and a laser top electrode over the laser core component. The EAM includes a modulator bottom electrode over the substrate, a modulator core component over the modulator bottom electrode, and a modulator top electrode over the modulator core component. Herein, at least portions of the substrate, which are directly under the laser bottom electrode and directly under the modulator bottom electrode, are electrically non-conductive. The laser top electrode is isolated from the modulator top electrode, and the laser bottom electrode is isolated from the modulator bottom electrode.

In one embodiment of the EML, the substrate is electrically non-conductive and formed of one of a group consisting of Indium phosphide (InP), Gallium Arsenide (GaAs), or Silicon (Si).

According to another embodiment, the EML further includes a high resistance region, which resides over the substrate and separates the laser bottom electrode and the modulator bottom electrode.

In one embodiment of the EML, the laser bottom electrode and the modulator bottom electrode are surrounded by the high resistance region individually.

In one embodiment of the EML, the high resistance region is formed of a same material as the substrate.

In one embodiment of the EML, the high resistance region is formed of a different material from the substrate, and has a resistivity greater than 1000 ohms per square.

In one embodiment of the EML, the laser core component and the modulator core component are formed within a device block, which is vertically between the laser top electrode and the laser bottom electrode, and vertically between the modulator top electrode and the modulator bottom electrode.

In one embodiment of the EML, a first portion of the laser bottom electrode is underneath the device block, and a second portion of the laser bottom electrode extends beyond the device block and is exposed over the substrate. A first portion of the modulator bottom electrode is underneath the device block, and a second portion of the modulator bottom electrode extends beyond the device block and is exposed over the substrate.

In one embodiment of the EML, the laser element further includes a laser top contact formed over the laser top electrode, and a laser bottom contact formed over the second portion of the laser bottom electrode. The EAM further includes a modulator top contact formed over the modulator top electrode, and a modulator bottom contact formed over the second portion of the modulator bottom electrode.

According to another embodiment, the EML further includes a laser contact support block and a modulator contact support block. Herein, the laser contact support block is over the substrate and adjacent to a portion of the device block where the laser core component is located. The modulator contact support block is over the substrate and adjacent to a portion of the device block where the modulator core component is located. The laser top contact extends beyond the laser top electrode, and over the laser contact support block, such that the laser contact support block provides mechanical support to the laser top contact. The modulator top contact extends beyond the modulator top electrode, and over the modulator contact support block, such that the modulator contact support block provides mechanical support to the modulator top contact.

In one embodiment of the EML, the laser contact support block and the modulator contact support block are formed of Benzocyclobutene (BCB) or polyimide.

According to another embodiment, the EML further includes a termination resistor formed within the device block. The termination resistor is electrically coupled between the modulator top electrode and the modulator bottom electrode.

In one embodiment of the EML, the device block includes a top cladding layer, a grating layer, a multi-quantum well (MQW) region, and a bottom cladding layer. Herein, the bottom cladding layer is over the laser bottom electrode and the modulator bottom electrode, the MQW region is over the bottom cladding layer, the grating layer is over the MQW region, the top cladding layer is over the grating layer, and the laser top electrode and the modulator top electrode are over the top cladding layer. The laser core component is formed within the MQW region and the grating layer, and vertically aligned between the laser top electrode and the laser bottom electrode. The modulator core component is formed within the MQW region, and vertically aligned between the modulator top electrode and the modulator bottom electrode.

In one embodiment of the EML, the top cladding layer, the laser top electrode, and the modulator top electrode have a same polarity. The bottom cladding layer, the laser bottom electrode, and the modulator bottom electrode have a same polarity. The bottom cladding layer has an opposite polarity from the top cladding layer.

In one embodiment of the EML, the grating layer includes a number of grating elements, which are included in the laser core component and aligned underneath the laser top electrode.

According to another embodiment, the EML further includes a photodetector over the substrate. The photodetector and the EAM are located at opposite sides of the laser element. Herein, the photodetector includes a detector bottom electrode over the substrate, a detector core component is over the detector bottom electrode, and a detector top electrode is over the detector core component. At least a portion of the substrate directly under the detector bottom electrode is electrically non-conductive. The detector top electrode, the modulator top electrode, and the laser top electrode are isolated from each other, and the detector bottom electrode, the modulator bottom electrode, and the laser bottom electrode are isolated from each other.

According to another embodiment, the EML further includes a high resistance region, which resides over the substrate, and separates the laser bottom electrode, the modulator bottom electrode, and the detector bottom electrode from each other.

In one embodiment of the EML, the laser bottom electrode, the modulator bottom electrode, and the detector bottom electrode are surrounded by the high resistance region individually.

In one embodiment of the EML, the laser core component, the modulator core component, and the detector core component are formed within a device block, which is vertically between the laser top electrode and the laser bottom electrode, vertically between the modulator top electrode and the modulator bottom electrode, and vertically between the detector top electrode and the detector bottom electrode.

In one embodiment of the EML, the device block includes a top cladding layer, a grating layer, a MQW region, and a bottom cladding layer. Herein, the bottom cladding layer is over the laser bottom electrode and the modulator bottom electrode, the MQW region is over the bottom cladding layer, the grating layer is over the MQW region, the top cladding layer is over the grating layer, and the laser top electrode and the modulator top electrode are over the top cladding layer. The laser core component is formed within the MQW region and the grating layer, and vertically aligned between the laser top electrode and the laser bottom electrode. The modulator core component is formed within the MQW region, and vertically aligned between the modulator top electrode and the modulator bottom electrode. The detector core component is formed within the MQW region, and vertically aligned between the detector top electrode and the detector bottom electrode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1B:
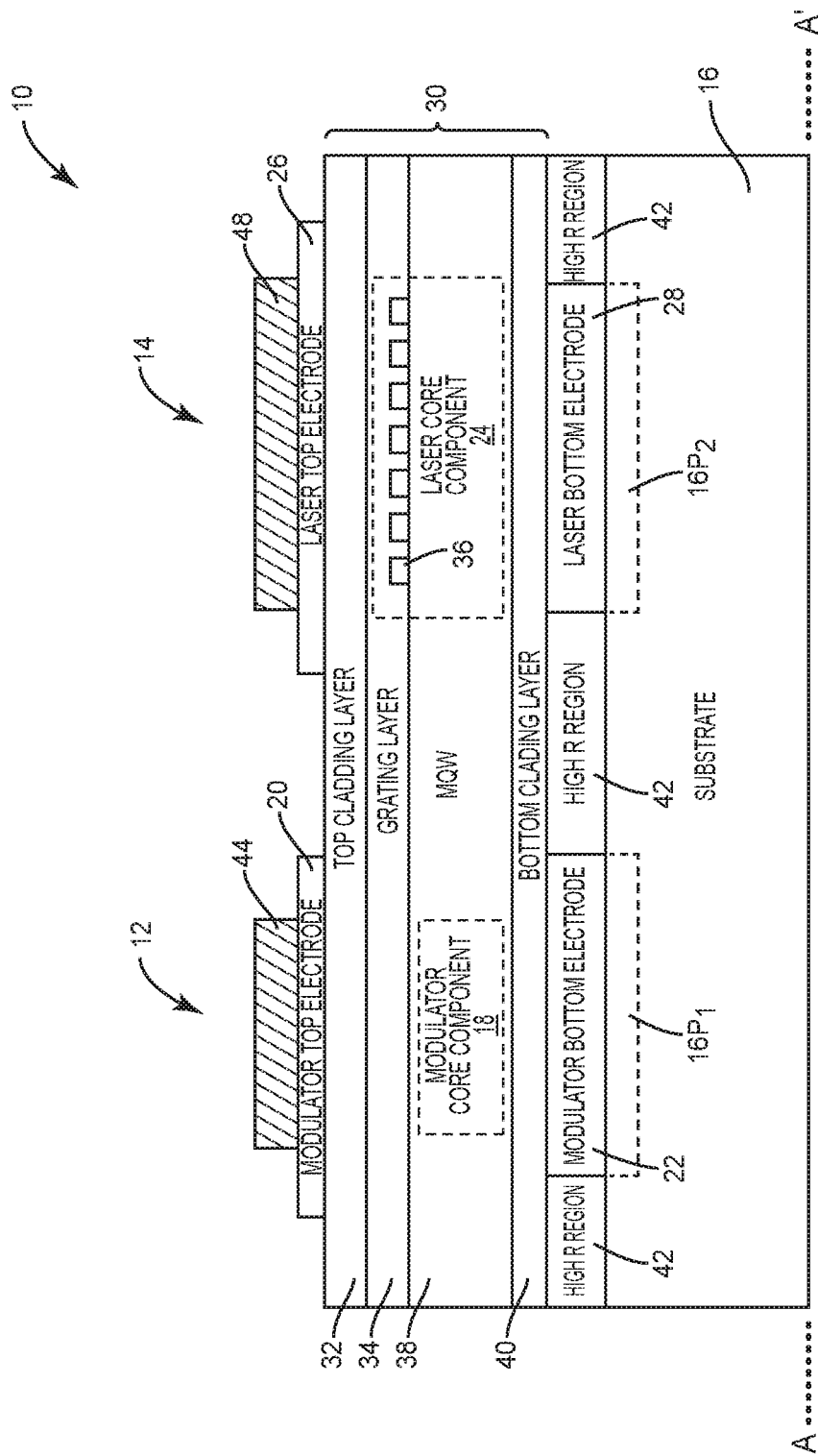

FIGS. 1A-1B provide an exemplary externally modulated laser (EML) with electrically isolated electrodes according to one embodiment of the present disclosure.

Figure 2:
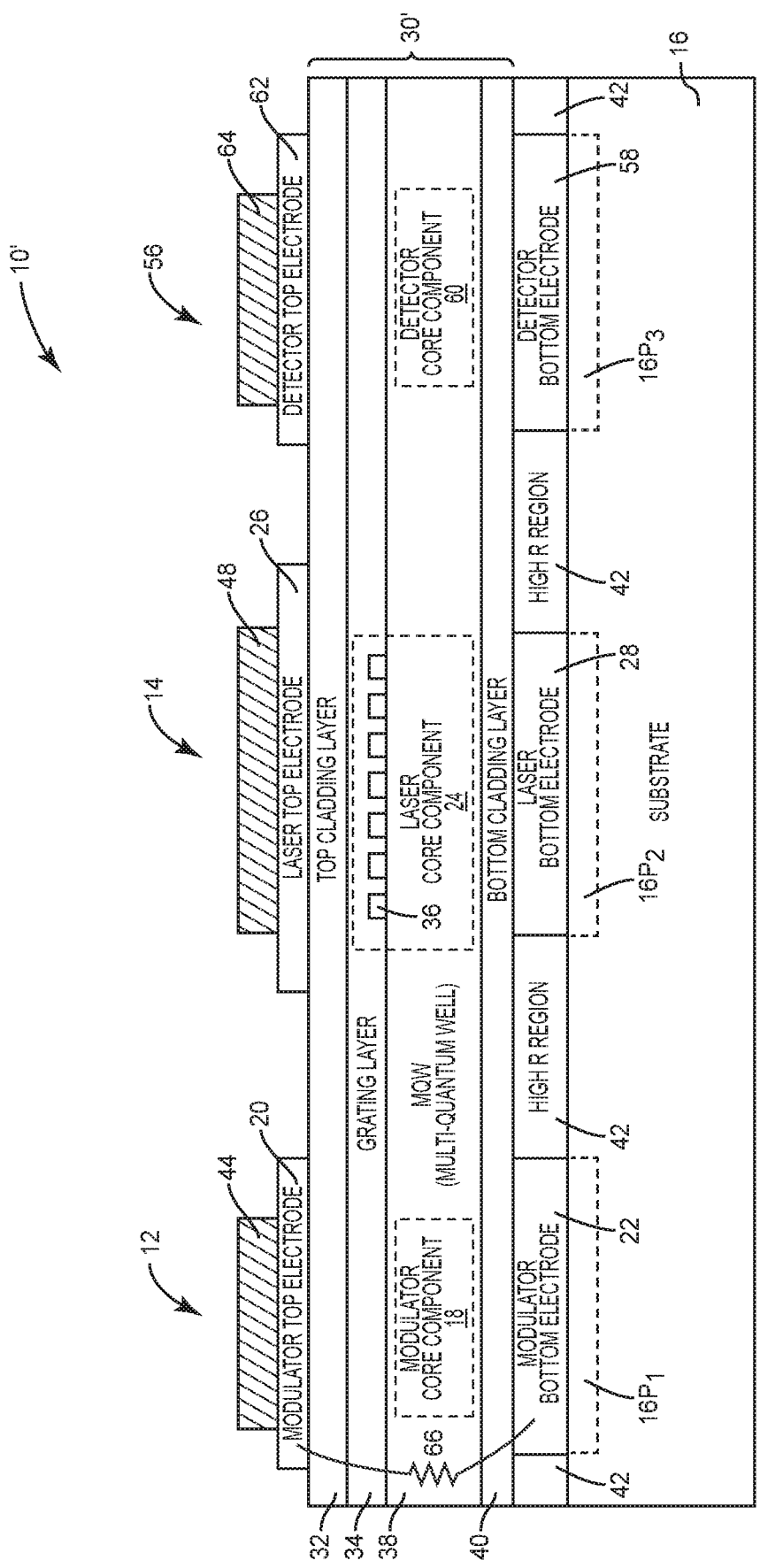

FIG. 2 provides an alternative EML according to one embodiment of the present disclosure.

It will be understood that for clear illustrations, FIGS. 1A-2 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a monolithic externally modulated laser (EML) with electrically isolated electrodes. FIG. 1A illustrates a three-dimensional (3D) version of an exemplary EML 10 according to one embodiment of the present disclosure, and FIG. 1B illustrates a cross-sectional version of the exemplary EML 10 along the dotted-line A-A' in FIG. 1A. The EML 10 includes an electro-absorption modulator (EAM) 12, a laser element 14, and a substrate 16. Herein, both the EAM 12 and the laser element 14 reside over the substrate 16. The substrate 16 may be formed from one or more electrically non-conductive materials, such as Indium phosphide (InP), Gallium Arsenide (GaAs), or Silicon (Si), or formed from an electrically conductive material with ion implantation areas (details will be shown in following descriptions).

In detail, the EAM 12 includes a modulator core component 18, a modulator top electrode 20, and a modulator bottom electrode 22. The modulator bottom electrode 22 is over the substrate 16, the modulator core component 18 is over the modulator bottom electrode 22, and the modulator top electrode 20 is over the modulator core component 18. The laser element 14 includes a laser core component 24, a laser top electrode 26, and a laser bottom electrode 28. The laser bottom electrode 28 is over the substrate 16, the laser core component 24 is over the laser bottom electrode 28, and the laser top electrode 26 is over the laser core component 24. Herein, the modulator core component 18 and the laser core component 24 are formed within a device block 30, which is vertically between the modulator top electrode 20 and the modulator bottom electrode 22, and vertically between the laser top electrode 26 and the laser bottom electrode 28. The modulator top electrode 20 and the laser top electrode 26 have no contact, and the modulator bottom electrode 22 and the laser bottom electrode 28 have no contact.

As illustrated in FIG. 1B, the device block 30 includes a top cladding layer 32, a grating layer 34 with a number of grating elements 36 (only one grating element is labeled with a reference number for clarity), a multi-quantum well (MQW) region 38, and a bottom cladding layer 40. The bottom cladding layer 40 is over the modulator bottom electrode 22 and the laser bottom electrode 28, the MQW region 38 is over the bottom cladding layer 40, the grating layer 34 is over the MQW region 38, the top cladding layer 32 is over the grating layer 34, and the modulator top electrode 20 and the laser top electrode 26 are over the top cladding layer 32. Herein, the modulator core component 18 is formed within the MQW region 38, and vertically aligned between the modulator top electrode 20 and the modulator bottom electrode 22. The laser core component 24 is formed within the MQW region 38 and the grating layer 34, and vertically aligned between the laser top electrode 26 and the laser bottom electrode 28. The grating elements 36 are included in the laser core component 24 and aligned underneath the laser top electrode 26.

Both the top cladding layer 32 and the bottom cladding layer 40 are electrically non-conductive, and may be formed of one or more materials with low refractive index, such as InP, GaAs, Aluminum Gallium Arsenide (AlGaAs), or Indium Gallium Phosphide (InGaP). Therefore, optical light created by the laser core component 24 will be confined within the MQW region 38, and will be effectively propagated to the modulator core component 18. Herein, the top cladding layer 32, the modulator top electrode 20, and the laser top electrode 26 have a same polarity, while the bottom cladding layer 40, the modulator bottom electrode 22, and the laser bottom electrode 28 have a same polarity. The bottom cladding layer 40 has an opposite polarity from the top cladding layer 32. For instance, if the modulator top electrode 20 and the laser top electrode 26 are doped with p-type dopant(s), the top cladding layer 32 will be p-type, and the bottom cladding layer 40, the modulator bottom electrode 22, and the laser bottom electrode 28 will be n-type. Typically, the modulator top electrode 20 and the laser top electrode 26 have a higher doping density than the top cladding layer 32, and the modulator bottom electrode 22 and the laser bottom electrode 28 have a higher doping density than the bottom cladding layer 40.

In addition, the EML 10 further includes a high resistance region 42, which resides over the substrate 16 and surrounds the modulator bottom electrode 22 and the laser bottom electrode 28 individually. As such, a portion of the high resistance region 42 is between the modulator bottom electrode 22 and the laser bottom electrode 28, and separates one from the other. The high resistance region 42 may be formed from one or more materials with a high resistivity greater than 1000 ohms per square, such as ion implant. Herein, the lower the resistivity of the high resistance region 42, the wider the in-between portion of the high resistance region 42 (between the modulator bottom electrode 22 and the laser bottom electrode 28) might be. In one embodiment, the high resistance region 42 may have a same thickness as the modulator bottom electrode 22 and the laser bottom electrode 28, so as to provide a flat surface to the bottom cladding layer 40.

The modulator top electrode 20 and the laser top electrode 26 are isolated from each other, because electrons cannot pass through the top cladding layer 32 or through air between the modulator top electrode 20 and the laser top electrode 26. When the substrate 16 is formed from one or more electrically non-conductive materials, the modulator bottom electrode 22 and the laser bottom electrode 28 are isolated from each other. It is because the electrons cannot pass through the bottom cladding layer 40, or through the in-between portion of the high resistance region 42 (between the modulator bottom electrode 22 and the laser bottom electrode 28), or through the substrate 16. The high resistance region 42 may be formed of a same or different material as the substrate 16. When the substrate 16 is formed from an electrically conductive material, at least a first portion of the substrate 16P1 directly under the modulator bottom electrode 22 and a second portion of the substrate 16P2 directly under the laser bottom electrode 28 are applied with ion implantation to provide electron insulating areas adjacent to the modulator bottom electrode 22 and the laser bottom electrode 28, respectively. The electrons, therefore, cannot pass from the modulator bottom electrode 22 to the laser bottom electrode 28 due to the first portion of the substrate 16P1 and the second portion of the substrate 16P2. Consequently, the modulator bottom electrode 22 and the laser bottom electrode 28 are still isolated from each other.

It is clear that the EAM 12 and the laser element 14 have isolated electrode pairs, and therefore, the EAM 12 and the laser element 14 can accommodate different signals/powers. For instance, the laser top electrode 26 may be coupled to a DC voltage and the laser bottom electrode 28 may be grounded, while the modulator top electrode 20 and the modulator bottom electrode 22 may be implemented as differential signal inputs, such that the EAM 12 may be driven by differential signals. In another instance, both the modulator bottom electrode 22 and the laser bottom electrode 28 may be grounded, while the laser top electrode 26 may be coupled to a DC voltage and the modulator top electrode 20 may be implemented as a single-ended signal input (such that the EAM 12 may be driven by a single-ended signal).

The EAM 12 may further include a modulator top contact 44 and a modulator bottom contact 46 for external connections. Similarly, the laser element 14 may further include a laser top contact 48 and a laser bottom contact 50 for external connections. In one embodiment, a first portion of the modulator bottom electrode 22 is underneath the device block 30, and a second portion of the modulator bottom electrode 22 extends beyond the device block 30 and is exposed over the substrate 16. A first portion of the laser bottom electrode 28 is underneath the device block 30, and a second portion of the laser bottom electrode 28 extends beyond the device block 30 and is exposed over the substrate 16. Herein, the modulator top contact 44 is formed over the modulator top electrode 20, and the modulator bottom contact 46 is formed over the second portion of the modulator bottom electrode 22. The laser top contact 48 is formed over the laser top electrode 26, and the laser bottom contact 50 is formed over the second portion of the laser bottom electrode 28.

In addition, the EML 10 may further include a modulator contact support block 52 and a laser contact support block 54. The modulator contact support block 52 resides over the substrate 16 or over the high resistance region 42, is adjacent to a portion of the device block 30 where the modulator core component 18 is located, and is opposite the second portion of the modulator bottom electrode 22. The modulator contact support block 52 may have a thickness equal to a combined thickness of the device block 30 and the modulator top electrode 20. Herein, the modulator top contact 44 extends beyond the modulator top electrode 20, and over the modulator contact support block 52, such that the modulator contact support block 52 provides mechanical support to the modulator top contact 44.

Similarly, the laser contact support block 54 resides over the substrate 16 or over the high resistance region 42, is adjacent to a portion of the device block 30 where the laser core component 24 is located, and is opposite the second portion of the laser bottom electrode 28. The laser contact support block 54 may have a thickness equal to a combined thickness of the device block 30 and the laser top electrode 26. Herein, the laser top contact 48 extends beyond the laser top electrode 26, and over the laser contact support block 54, such that the laser contact support block 54 provides mechanical support to the laser top contact 48. In one embodiment, the modulator contact support block 52 and the laser contact support block 54 may be located at a same side of the device block 30. In another embodiment, the modulator contact support block 52 and the laser contact support block 54 may be located at opposite sides of the device block 30. The modulator contact support block 52 and the laser contact support block 54 may be electrically non-conductive, and formed from one or more materials used for device block 30 or a spin-on dielectric material, such as Benzocyclobutene (BCB) or polyimide.

FIG. 2 provides an alternative EML 10' with electrically isolated electrodes. Besides the EAM 12, the laser element 14, and the substrate 16, the alternative EML 10' may further include a photodetector 56 residing over the substrate 16. The photodetector 56 and the EAM 12 are located at opposite sides of the laser element 14. The photodetector 56 is configured to monitor the output power from the laser element 14. The photodetector 56 includes a detector bottom electrode 58 over the substrate 16, a detector core component 60 over the detector bottom electrode 58, and a detector top electrode 62 over the detector core component 60. The detector bottom electrode 58, the detector core component 60, and the detector top electrode 62 are aligned vertically.

In detail, the detector bottom electrode 58 is formed under the bottom cladding layer 40 of the device block 30. The detector core component 60 is formed within the MQW region 38 of the device block 30, and the detector core component 60 and the modulator core component 18 are located at opposite sides of the laser core component 24. The detector top electrode 62 is formed over the top cladding layer 32. Herein, the detector bottom electrode 58 has a same polarity as the bottom cladding layer 40, and the detector top electrode 62 has a same polarity as the top cladding layer 32. Typically, the detector bottom electrode 58 has a higher doping density than the bottom cladding layer 40 and the detector top electrode 62 has a higher doping density than the top cladding layer 32. The detector bottom electrode 58, the modulator bottom electrode 22, and the laser bottom electrode 28 have no contact, and the detector top electrode 62, the modulator top electrode 20, and the laser top electrode 26 have no contact.

Herein, the detector bottom electrode 58 is also surrounded by the high resistance region 42, such that a portion of the high resistance region 42 separates the detector bottom electrode 58 from the laser bottom electrode 28. In one embodiment, the high resistance region 42, the modulator bottom electrode 22, the laser bottom electrode 28, and the detector bottom electrode may have a same thickness, so as to provide a flat surface to the bottom cladding layer 40.

When the substrate 16 is formed from one or more electrically non-conductive materials, the modulator bottom electrode 22, the laser bottom electrode 28, and the detector bottom electrode 58 are isolated from each other. It is because the electrons cannot pass through the bottom cladding layer 40, or through the portions of the high resistance region 42 in between, or through the substrate 16. When the substrate 16 is formed from an electrically conductive material, at least the first portion of the substrate $16P_1$ directly under the modulator bottom electrode 22, the second portion of the substrate $16P_2$ directly under the laser bottom electrode 28, and a third portion of the substrate $16P_3$ directly under the detector bottom electrode 58 are applied with ion implantation to provide electron insulating areas adjacent to the modulator bottom electrode 22, the laser bottom electrode 28, and the detector bottom electrode 58, respectively. The electrons, therefore, cannot pass from the modulator bottom electrode 22 to the laser bottom electrode 28, or cannot pass from the laser bottom electrode 28 to the detector bottom electrode 58, or cannot pass from the modulator electrode 22 to the detector bottom electrode 58. Consequently, the modulator bottom electrode 22, the laser bottom electrode 28, and the detector bottom electrode 58 are isolated from each other. The modulator top electrode 20, the laser top electrode 26, and the detector top electrode 62 are isolated from each other, because electrons cannot pass through the top cladding layer 32 or through air in between. It is clear that the EMA 12, the laser element 14, and the photodetector 56 have isolated electrode pairs, and therefore, the EMA 12, the laser element 14, and the photodetector 56 can accommodate different signals/powers.

The photodetector 56 may further include a detector top contact 64 and a detector bottom contact (not shown) for external connections. In one embodiment, a first portion of the detector bottom electrode 58 is underneath the device block 30, and a second portion of the detector bottom electrode 58 extends beyond the device block 30 and is exposed over the substrate 16 (not shown). Herein, the detector top contact 64 is formed over the detector top electrode 62, and the detector bottom contact is formed over the second portion of the detector bottom electrode 58.

In some applications, the alternative EML 10' may further include a termination resistor 66, which is configured to help amplifiers (not shown, off the EML 10') to drive the EAM 12 effectively. Herein, the termination resistor 66 may be parallel to the EAM 12, formed within the device block 30, and electrically coupled between the modulator top electrode 20 and the modulator bottom electrode 22. In some applications, the termination resistor 66 may be parallel to the EAM 12, electrically coupled between the modulator top electrode 20 and the modulator bottom electrode 22, but not integrated in the alternative EML 10'.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a substrate;
a laser element comprising a laser core component, a laser top electrode, and a laser bottom electrode, wherein:
the laser element resides over the substrate; and
the laser core component is vertically aligned between the laser top electrode and the laser bottom electrode, wherein the laser bottom electrode is over the substrate, the laser core component is over the laser bottom electrode, and the laser top electrode is over the laser core component; and
an electro-absorption modulator (EAM) comprising: a modulator core component, a modulator top electrode, and a modulator bottom electrode, wherein:
the EAM resides over the substrate;
the modulator core component is vertically aligned between the modulator top electrode and the modulator bottom electrode, wherein the modulator bottom electrode is over the substrate, the modulator core component is over the modulator bottom electrode, and the modulator top electrode is over the modulator core component;
at least portions of the substrate, which are directly under the laser bottom electrode and directly under the modulator bottom electrode, are electrically non-conductive; and
the laser top electrode is isolated from the modulator top electrode, and the laser bottom electrode is isolated from the modulator bottom electrode.

2. The apparatus of claim 1 wherein the substrate is electrically non-conductive and formed of one of a group consisting of Indium phosphide (InP), Gallium Arsenide (GaAs), or Silicon (Si).

3. The apparatus of claim 1 further comprising a high resistance region, which resides over the substrate and separates the laser bottom electrode and the modulator bottom electrode.

4. The apparatus of claim 3 wherein the laser bottom electrode and the modulator bottom electrode are surrounded by the high resistance region individually.

5. The apparatus of claim 3 wherein the high resistance region is formed of a same material as the substrate.

6. The apparatus of claim 3 wherein the high resistance region is formed of a different material from the substrate, and has a resistivity greater than 1000 ohms per square.

7. The apparatus of claim 1 wherein the laser core component and the modulator core component are formed within a device block, which is vertically between the laser top electrode and the laser bottom electrode, and vertically between the modulator top electrode and the modulator bottom electrode.

8. The apparatus of claim 7 wherein:
a first portion of the laser bottom electrode is underneath the device block, and a second portion of the laser bottom electrode extends beyond the device block and is exposed over the substrate; and
a first portion of the modulator bottom electrode is underneath the device block, and a second portion of the modulator bottom electrode extends beyond the device block and is exposed over the substrate.

9. The apparatus of claim 8 wherein:
the laser element further comprises a laser top contact formed over the laser top electrode, and a laser bottom contact formed over the second portion of the laser bottom electrode; and
the EAM further comprises a modulator top contact formed over the modulator top electrode, and a modulator bottom contact formed over the second portion of the modulator bottom electrode.

10. The apparatus of claim 9 further comprising a laser contact support block and a modulator contact support block, wherein:
the laser contact support block is over the substrate and adjacent to a portion of the device block where the laser core component is located;
the modulator contact support block is over the substrate and adjacent to a portion of the device block where the modulator core component is located;
the laser top contact extends beyond the laser top electrode, and over the laser contact support block, such that the laser contact support block provides mechanical support to the laser top contact; and
the modulator top contact extends beyond the modulator top electrode, and over the modulator contact support block, such that the modulator contact support block provides mechanical support to the modulator top contact.

11. The apparatus of claim 10 wherein the laser contact support block and the modulator contact support block are formed of Benzocyclobutene (BCB) or polyimide.

12. The apparatus of claim 7 further comprising a termination resistor formed within the device block, wherein the termination resistor is electrically coupled between the modulator top electrode and the modulator bottom electrode.

13. The apparatus of claim 7 wherein the device block comprises a top cladding layer, a grating layer, a multi-quantum well (MQW) region, and a bottom cladding layer, wherein:
the bottom cladding layer is over the laser bottom electrode and the modulator bottom electrode, the MQW region is over the bottom cladding layer, the grating layer is over the MQW region, the top cladding layer is over the grating layer, and the laser top electrode and the modulator top electrode are over the top cladding layer;
the laser core component is formed within the MQW region and the grating layer; and
the modulator core component is formed within the MQW region.

14. The apparatus of claim 13 wherein:
the top cladding layer, the laser top electrode, and the modulator top electrode have a same polarity;
the bottom cladding layer, the laser bottom electrode, and the modulator bottom electrode have a same polarity; and
the bottom cladding layer has an opposite polarity from the top cladding layer.

15. The apparatus of claim 13 wherein the grating layer comprises a plurality of grating elements, which are included in the laser core component and aligned underneath the laser top electrode.

16. The apparatus of claim 1 further comprising a photodetector over the substrate, wherein:
the photodetector and the EAM are located at opposite sides of the laser element;
the photodetector includes a detector bottom electrode over the substrate, a detector core component over the detector bottom electrode, and a detector top electrode over the detector core component;
at least a portion of the substrate directly under the detector bottom electrode is electrically non-conductive; and
the detector top electrode, the modulator top electrode, and the laser top electrode are isolated from each other, and the detector bottom electrode, the modulator bottom electrode, and the laser bottom electrode are isolated from each other.

17. The apparatus of claim 16 further comprising a high resistance region, which resides over the substrate, and separates the laser bottom electrode, the modulator bottom electrode, and the detector bottom electrode from each other.

18. The apparatus of claim 17 wherein the laser bottom electrode, the modulator bottom electrode, and the detector bottom electrode are surrounded by the high resistance region individually.

19. The apparatus of claim 17 wherein the high resistance region is formed of a same material as the substrate.

20. The apparatus of claim 17 wherein the high resistance region is formed of a different material from the substrate, and has a resistivity greater than 1000 ohms per square.

21. The apparatus of claim 16 wherein the laser core component, the modulator core component, and the detector core component are formed within a device block, which is vertically between the laser top electrode and the laser bottom electrode, vertically between the modulator top electrode and the modulator bottom electrode, and vertically between the detector top electrode and the detector bottom electrode.

22. The apparatus of claim 21 wherein the device block comprises a top cladding layer, a grating layer, a multi-quantum well (MQW) region, and a bottom cladding layer, wherein:
the bottom cladding layer is over the laser bottom electrode and the modulator bottom electrode, the MQW region is over the bottom cladding layer, the grating layer is over the MQW region, the top cladding layer is over the grating layer, and the laser top electrode and the modulator top electrode are over the top cladding layer;
the laser core component is formed within the MQW region and the grating layer;
the modulator core component is formed within the MQW region; and
the detector core component is formed within the MQW region, and vertically aligned between the detector top electrode and the detector bottom electrode.

* * * * *